United States Patent [19]
Danz et al.

[11] Patent Number: 5,805,020
[45] Date of Patent: Sep. 8, 1998

[54] SILENT START CLASS D AMPLIFIER

[75] Inventors: George Edward Danz, Cary; Larry A. King; John K. Fogg, both of Durham, all of N.C.

[73] Assignee: Harris Corporation, Melbourne, Fla.

[21] Appl. No.: 671,453

[22] Filed: Jun. 27, 1996

[51] Int. Cl.[6] ..................................................... H03F 3/38
[52] U.S. Cl. ............................................. 330/10; 330/251
[58] Field of Search ................................. 330/10, 207 A, 330/251; 381/120, 121

[56] References Cited

U.S. PATENT DOCUMENTS

| | | | |
|---|---|---|---|
| 4,458,208 | 7/1984 | Abe ............................................. | 330/10 |
| 4,673,889 | 6/1987 | Cini et al. .................................. | 330/10 |
| 4,992,751 | 2/1991 | Attwood et al. .......................... | 330/10 |
| 5,389,829 | 2/1995 | Milazzo ............................... | 330/251 X |
| 5,410,592 | 4/1995 | Wagner et al. ...................... | 330/251 X |

OTHER PUBLICATIONS

Danz, G.E., "Class–D Audio II Evaluation Board (HIP4080AEVAL2)," *Harris Semiconductor APPNOTE*, No. AN9525.1, Oct. 1995.

Sherman, J.D., "Class D Amplifiers Provide High Efficiency for Audio Systems," *EDN Design Feature*, May 25, 1995, pp. 103–110.

Pauly, D.E., "High Fidelity Switching Audio Amplifiers Using TMOS Power MOSEFETs," *Motorola Semiconductor Application Note*, 1989.

*Primary Examiner*—Steven J. Mottola
*Attorney, Agent, or Firm*—Jaeckle Fleischmann & Mugel, LLP

[57] ABSTRACT

Start up noise in a class D amplifier—is corrected by adding an analog switch S1 to the integrator circuit A1. A resistor R3 in the feedback path of A1 prevents A1 from saturating. In an alternate embodiment silent start switch connects a variable resistance to the comparator input. The resistance gradually increases.

11 Claims, 6 Drawing Sheets

SILENT START CLASS D AMPLIFIER

BACKGROUND

Class D amplifiers convert an audio signal into high-frequency pulses that switch the output in accordance with the audio input signal. Some class D amplifier use pulse width modulators to generate a series of conditioning pulses that vary in width with the audio signal's amplitude. The varying-width pulses switch the power-output transistors at a fixed frequency. Other class D amplifier rely upon pulse density modulators. Still other class D amplifiers may rely upon other types of pulse modulators. For heuristic purposes, the following discussion will only refer to pulse width modulators, but those skilled in the art will recognize that class D amplifiers may be configured with other types of modulators. The output of the class D amplifier is fed into a lowpass filter that converts the pulses back into an amplified audio signal that drives one or more audio speakers. This design approach produces an amplifier with better than 90% efficiency and that is more complex than its linear counterpart.

The class D amplifier requires an integrator, a duty-cycle modulator, a switch predrive circuit, and an output filter. The half-bridge class D amplifier using constant-frequency, duty-cycle modulation (FIG. 1), sums the square-wave output of the switching power transistors with the audio input to provide negative feedback. One cannot take the feedback after the lowpass filter unless one uses a complicated compensation network to handle the phase shift that the filter introduces. A two-pole filter, for example, would introduce a 180° phase shift, which would cause the circuit to oscillate.

The square-wave output is synchronous with the audio input, but one must remove the carrier. The integrator sums the two signals and simulates the effect of the output filter. The circuit feeds the resultant error signal into the duty-cycle modulator, which comprises a comparator and a triangle-wave generator (FIGS. 2 and 3). Then, the circuit compares the triangle wave to the error signal to produce the modulated output.

The modulated output is a square wave whose duty cycle is proportional to the input signal. In the half-bridge circuit, this output drives the upper and lower power switches in antiphase; the circuit always drives one switch into saturation while it cuts the other off. The square wave causes the switches to change state as fast as possible, given the technology used to implement the switch. Fast switching limits the time that the switches spend in the linear operating region, thereby increasing efficiency and reducing heat generation. The combination of switching and conduction losses defines the upper bound of the amplifier's efficiency. The circuit filters out the high-frequency square wave that the power switches generate, leaving only the amplified audio signal. This signal then drives a ground-referenced speaker load.

It is common for class D amplifiers to make a loud thump when the power is turned on. Occasionally this start-up transient is enough to trip the over-current circuitry. Users who desire medium to high fidelity equipment find such start-up transient are not acceptable.

SUMMARY

This invention describes two embodiments of the solution to the problem of start-up thumps. The first embodiment operates on the control loop integrator to correct the problem. The second embodiment operates on the PWM comparator to correct the problem. These embodiments are shown in FIGS. 4 and 5, either one by itself would be sufficient to eliminate the start-up transient.

The first embodiment of the invention provides an input amplifier with a first input connected to the audio input signal and a second input connected trough a feedback path to the output of the bridge driver circuit. The input amplifier has a switch that has a first position to configure the input amplifier as an integrating amplifier and a second position to configure the input amplifier as a summing amplifier that sums the audio input and the feedback signal. The input amplifier has, in effect, two feedback paths between its output and its audio input. One feedback path comprises a summing resistor and the other feedback path comprises an integrating capacitor. The switch selects one of the two feedback paths. The input amplifier switch is connected in series with a summing resistor, said switch being responsive to a disable signal for selectively opening and closing the feedback path through the summing resistor. The class D amplifier with the silent start circuit may further comprise a bridge driver circuit and bridge circuit. The bridge driver circuit includes a plurality of power mosfet devices for receiving the output power driving pulses from the bridge driver circuit, means for applying the power driver pulses to the gates of the power mosfets to generate output power voltage pulses at a power voltage level.

Another embodiment of the invention uses the comparator to provide a silent start. The comparator has first and second inputs, the first input from the integrating amplifier and the second from a reference oscillator voltage signal. The comparator generates an output series of pulse width modulated pulses, each pulse having the amplitude of the reference voltage signal and a width proportional to the amplitude of the sampled audio signal. The series of pulses has a frequency substantially greater than said audio frequency. A switch is coupled to the first comparator input and operable in response to a disable signal to connect the first input of the comparator to a mute reference voltage source to generate a comparator output having a 50% duty cycle. The 50% duty cycle output will be filtered at the output filter and produces no voltage at the speaker. Under these conditions, the integrator will saturate because the control loop is open. Typically the reference voltage will be half the maximum voltage level of the oscillator voltage signal. In response to an enable signal, the switch gradually connects the output of the integrating amplifier to the first comparator input and gradually unsaturates the integrating amplifier. The switch means includes one or more variable resistors for gradually increasing the resistance between the mute reference source and the first comparator input and for gradually reducing the resistance between the integrator output and the comparator input when the switch means is placed in its enable position. The silent start amplifier switch is coupled to a current source and a capacitor. The current source and capacitor are used to generate the timing for the switch when the amplifier transitions from disable to enable.

DETAILED DESCRIPTION

Figure 1:
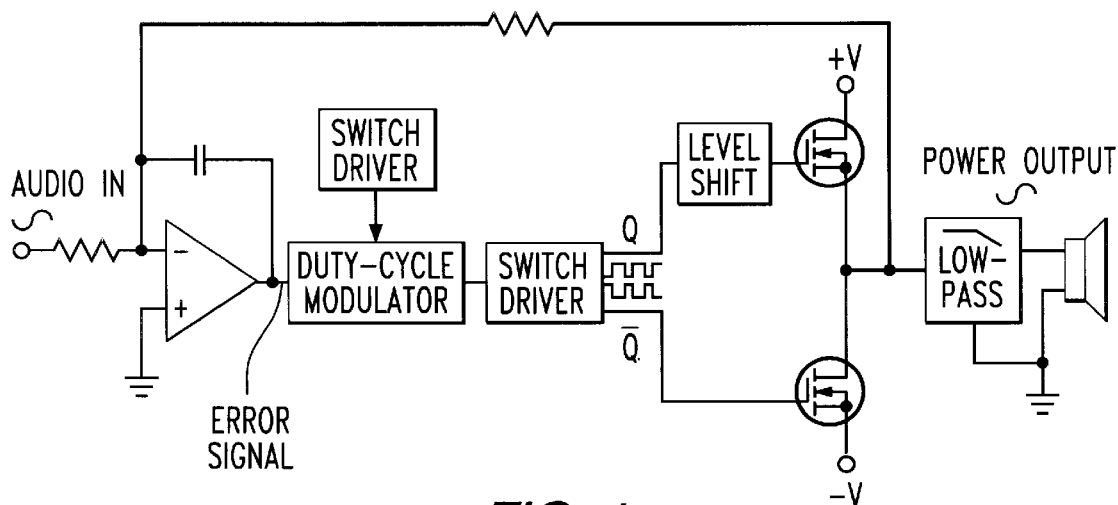
FIG. 1 is a circuit diagram of a prior art class D amplifier.
Figure 2:
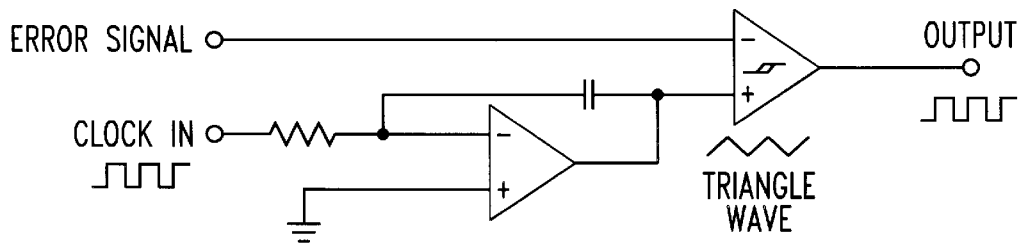
FIG. 2 is a partial circuit diagram of a prior art duty-cycle modulator/comparator.
Figure 3:
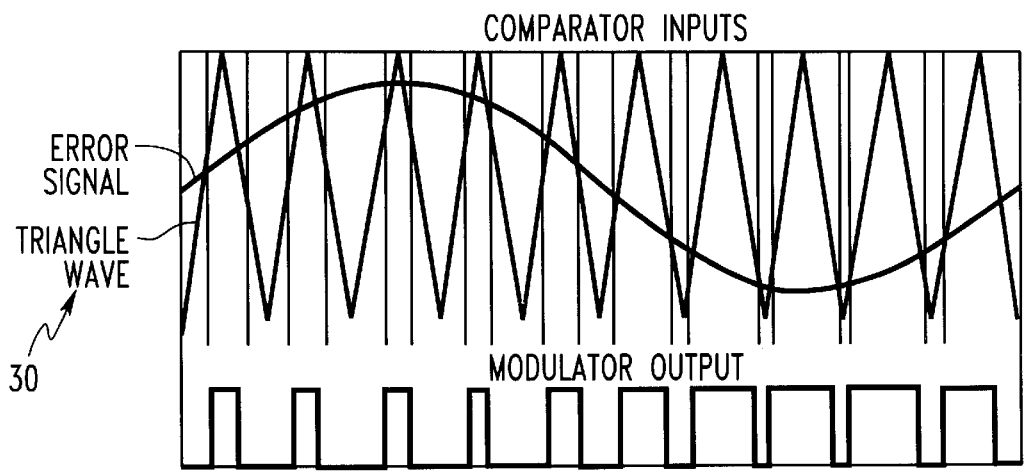
FIG. 3 is a waveform diagram of the input signals and the output signal of a class D amplifier.
Figure 4:
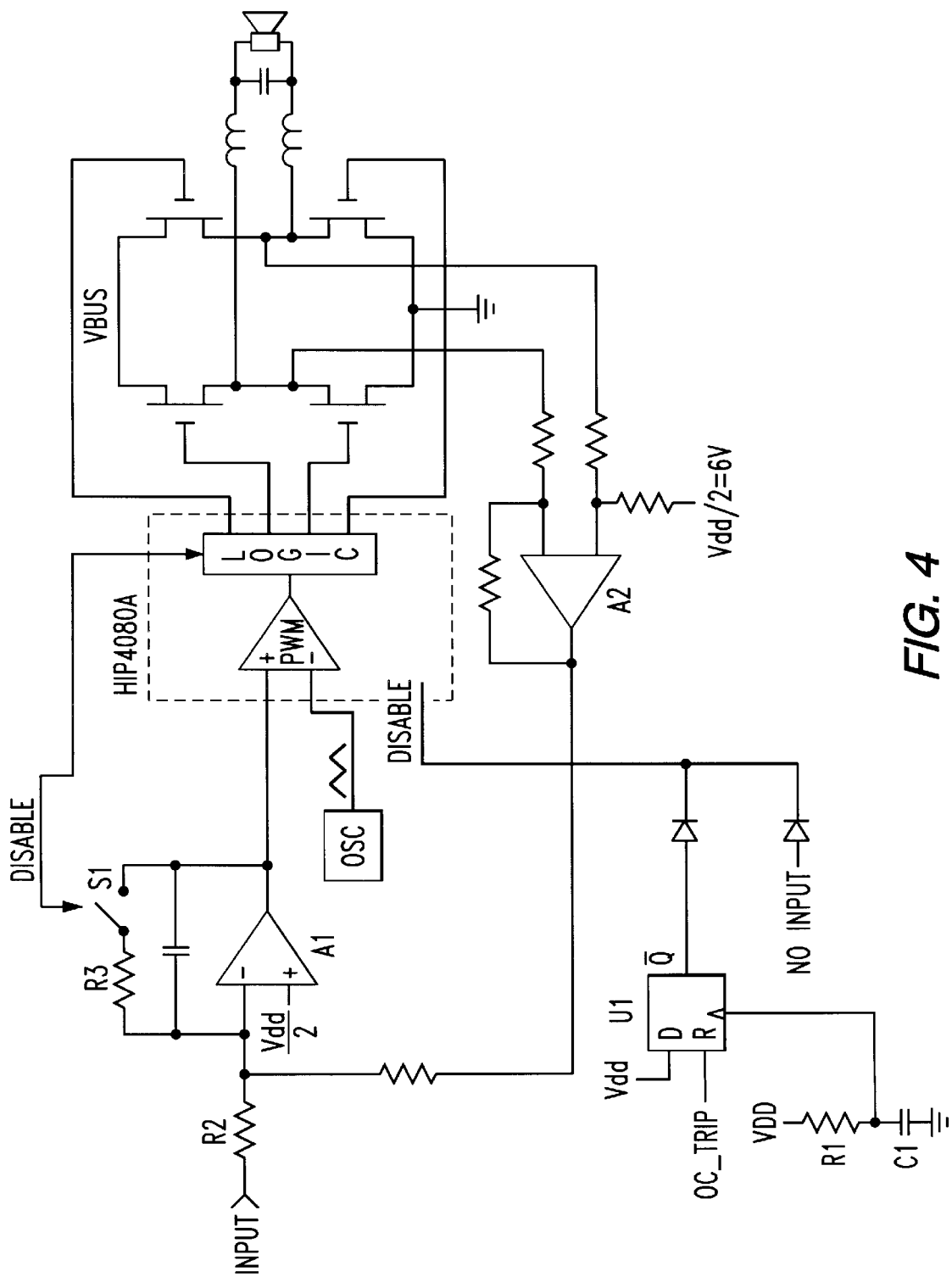
FIG. 4 is a circuit diagram of a first embodiment of a silent start class D amplifier.

FIG. 4 shows a first embodiment of a class D silent start switching audio amplifier 10. The problem that exists at start-up involves the integrator A1. When the amplifier 10 starts up, latch U1 initially outputs a disabled signal to prevent the bridge 12 from switching until there is sufficient bias voltage. After a delay set by R1, C1, the latch U1 is clocked and the amplifier is enabled. The disable/enable output from U1 is diode or'ed with another signal which detects the presence of an audio input to the amplifier. To conserve power, the 'no input' signal is used to shut off the gate drive signals to the bridge 12 via the bridge driver 14 when there is no input to the amplifier. A typical bridge driver is HIP4080A an integrated circuit manufactured and sold by Harris Corporation. After start-up, the latched output of U1 is used to disable the amplifier output if an over current is detected. The problem with shutting off the gate drive signals to the output bridge is that there is no longer any feedback to the integrator A1. Under these conditions the integrator A1 saturates at either the positive or negative power supply rail depending on the input signal and initial conditions. The thump occurs when the amplifier is re-enabled. The bridge starts switching and the error voltage drives the speaker voltage to full scale instantly. The feedback from the speaker (not shown) causes the integrator output to be corrected and it slews from its saturated output rail to follow the input. This large voltage slew on the integrator A1 and speaker output causes an explosive thump to the speaker. It is desireable to eliminate such thumps.

Analog switch S1 has been added to the integrator circuit A1. Switch S1 is controlled by the disable signal. When the output bridge 12 is disabled, the S1 switch is closed and A1 becomes a summing amplifier instead of an integrator. Since the bridge 12 is not switching, the voltage across the speaker drops to zero, and the output of A2 goes to +6 V. In this configuration A1 is an inverting amplifier with a gain of −R3/R2 times the input. R3 is chosen here so that A1 does not saturate prior to start-up. So, when the amplifier is enabled, the bridge 12 starts switching and switch S1 is opened. The error voltage output of A1 continues to follow the input as it was before S1 was opened, eliminating the start-up thump.

Figure 5:
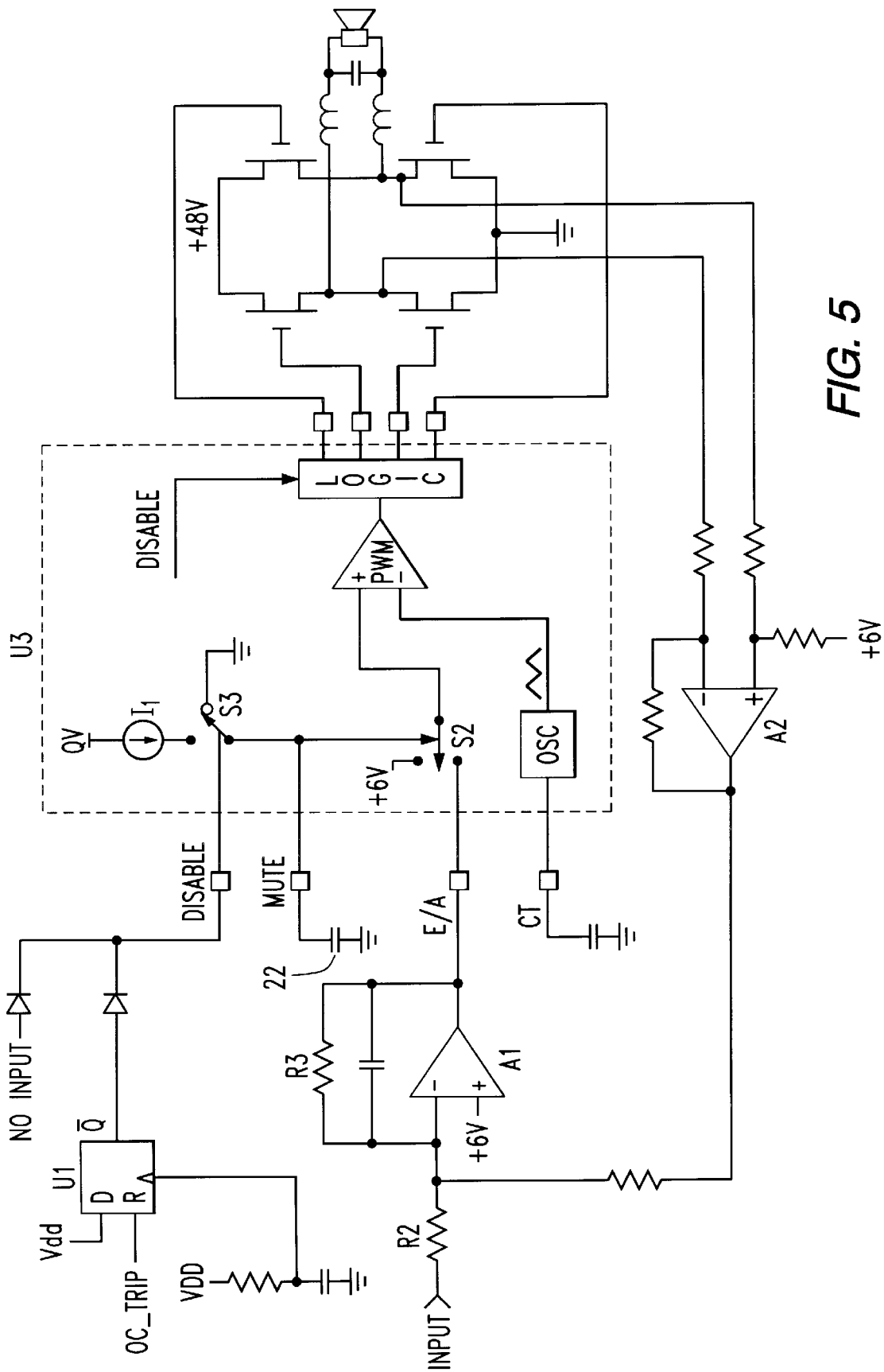
FIG. 5 is a circuit diagram of a second embodiment of a silent start class D amplifier.

A second embodiment of the a silent start amplifier is shown in FIG. 5 and further in FIGS. 6a–6d and 7. This embodiment relates to audio integrated circuit (IC) PWM controllers where the integration amplifier A1 is external to the IC.

Referring to FIG. 5, when the IC U3 is disabled, the switching of the output stops. S3 connects the mute signal to ground which controls switch S2 so that the + input to the PWM comparator 20 is connected to +6 V. When the disable signal is removed, switch S3 allows a current source to charge a capacitor 22 on the mute node and cause a slowly moving control voltage at switch S2. The switch S2 includes transmission gates more fully described in connection with FIG. 6. The transmission gates gradually turn on or off in accordance with the voltage across the capacitor 22. While the control voltage is low, the output begins to switch since the IC U3 is enabled. The PWM comparator 20 commands a 50% square wave regardless of the error signal because the + input to the comparator is at +6 V, the midpoint of the triangle wave on the − input of the comparator. The 50% duty cycle output of the H-Bridge 24 is filtered to result in zero voltage across the load 26. As the control voltage rises, the + input to the comparator 20 is switched from the +6 V reference to the input. There is a transition period where the + input to the PWM comparator 20 is connected to both the E/A input and the +6 V through variable resistors. The switch transition from +6 V to E/A is accomplished by slowly increasing the resistance between PMW+ and −6 V while decreasing the resistance between PMW+ and E/A. The switch transition is intentionally made to overlap to allow a gradual transition between a 50% duty cycle output and the normal operating condition. This allows the integrator to come out of saturation while the bridge output is still predominately controlled by the +6 V reference and eliminates the start-up transient.

Figures 6A, 6B, 6C, 6D:
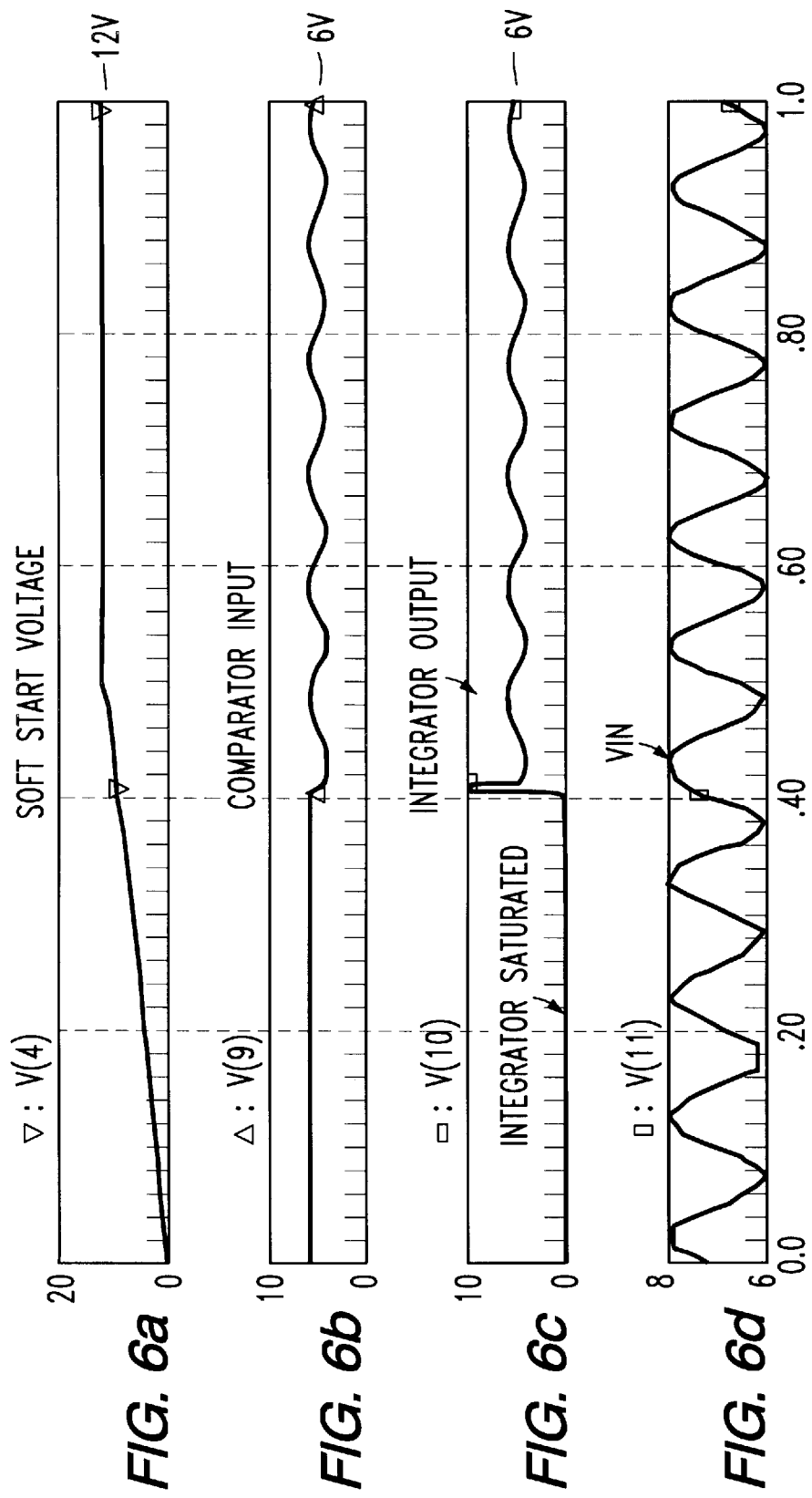
FIGS. 6a, 6b, 6c and 6d are wave form diagrams of the voltage signals for the circuit of FIG. 5.

A simulation of the start-up procedure is shown in FIGS. 6a–6d. The top graph of FIG. 6a is labeled the soft start voltage and represents the slowly rising control voltage on the mute pin. Graph 6c shows the output of the integrator A1 of FIG. 5 saturated to the negative supply rail, 0 V. Graph 6d shows the input signal. As the soft start voltage rises, the integrator recovers from saturation to follow the input. The sharp positive spike shown in FIG. 6c is a simulation anomaly and is not present in FIG. 6b. FIG. 6b represents the + comparator terminal. FIG. 6b shows a smooth transition between the +6 V reference and the input signal on the + input terminal of the comparator.

In operation, when the disable signal is high, the output is disabled, switch S3 is connected to ground and the + input to the PWM comparator 20 is connected to +6 V. The triangle wave 30 varies between +4 and +8 V, so the PWM has a 50% duty cycle. When the disable signal is removed, switch S3 connects to a current source $I_1$ through an external capacitor 22 on the mute pin. The current source $I_1$ gradually charge the capacitor 32 on the mute pin to +12 V. Simultaneously, switch S2 gradually connects the + input of the PWM comparator 20 to the output of the integrator A1 and disconnects the + input from +6 V. That gradual connection is accomplished by variable resistors (not shown) which gradually increase the resistance between the +6 V source and the + input and decrease the resistance between the A1 output and the + input to the PWM comparator. The variable resistors are N and P channel MOS field effect transistors (MOSFETs) and are internal to switch S2. The MOSFETs form transmission gates as will be explained in connection with FIG. 7. This allows A1 to gradually come out of saturation and follow the audio input having an ac signal riding on a +6 volt dc level.

Figure 7:
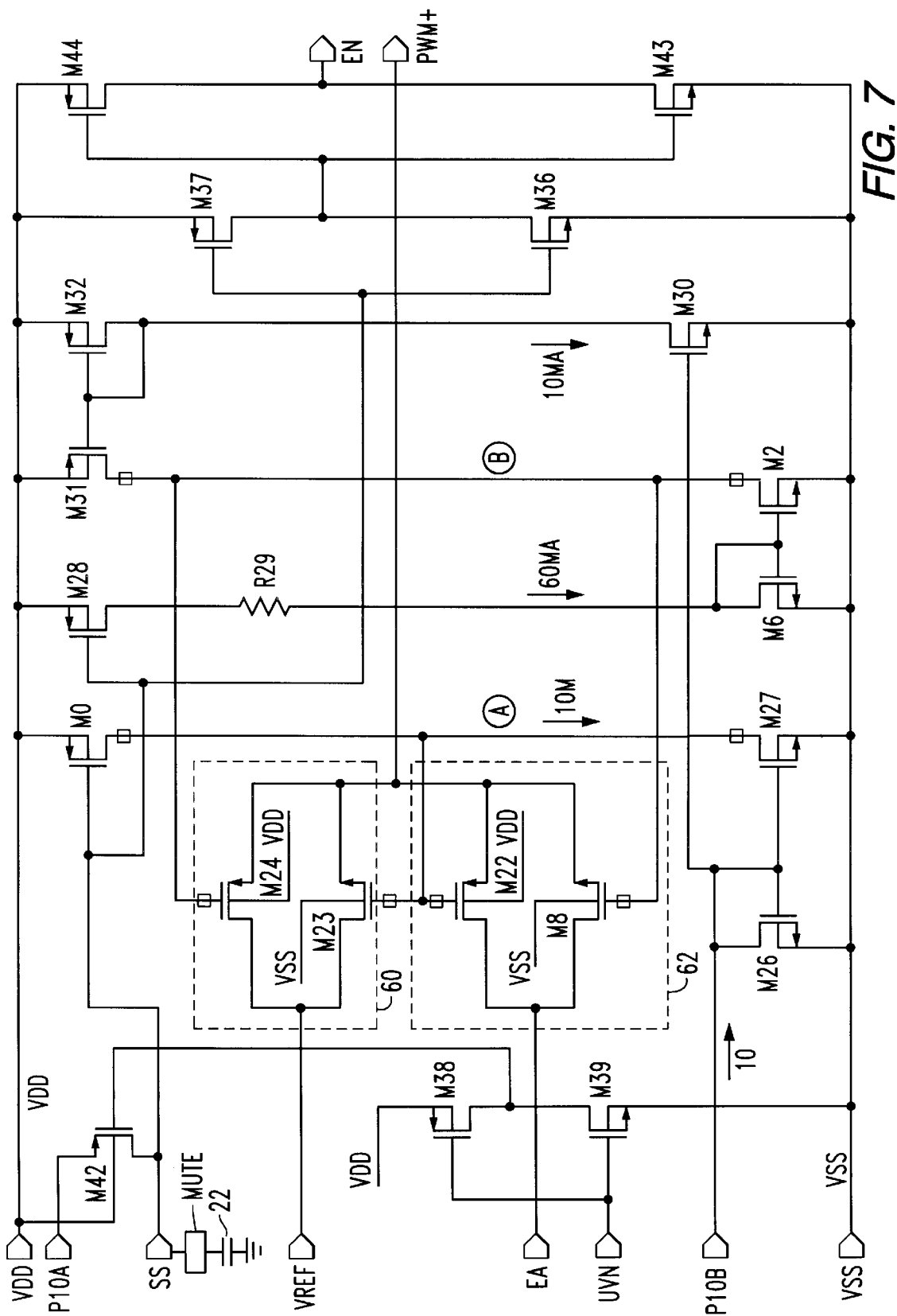
FIG. 7 is a detailed circuit schematic of the circuit shown in FIG. 5.
Figure 8:
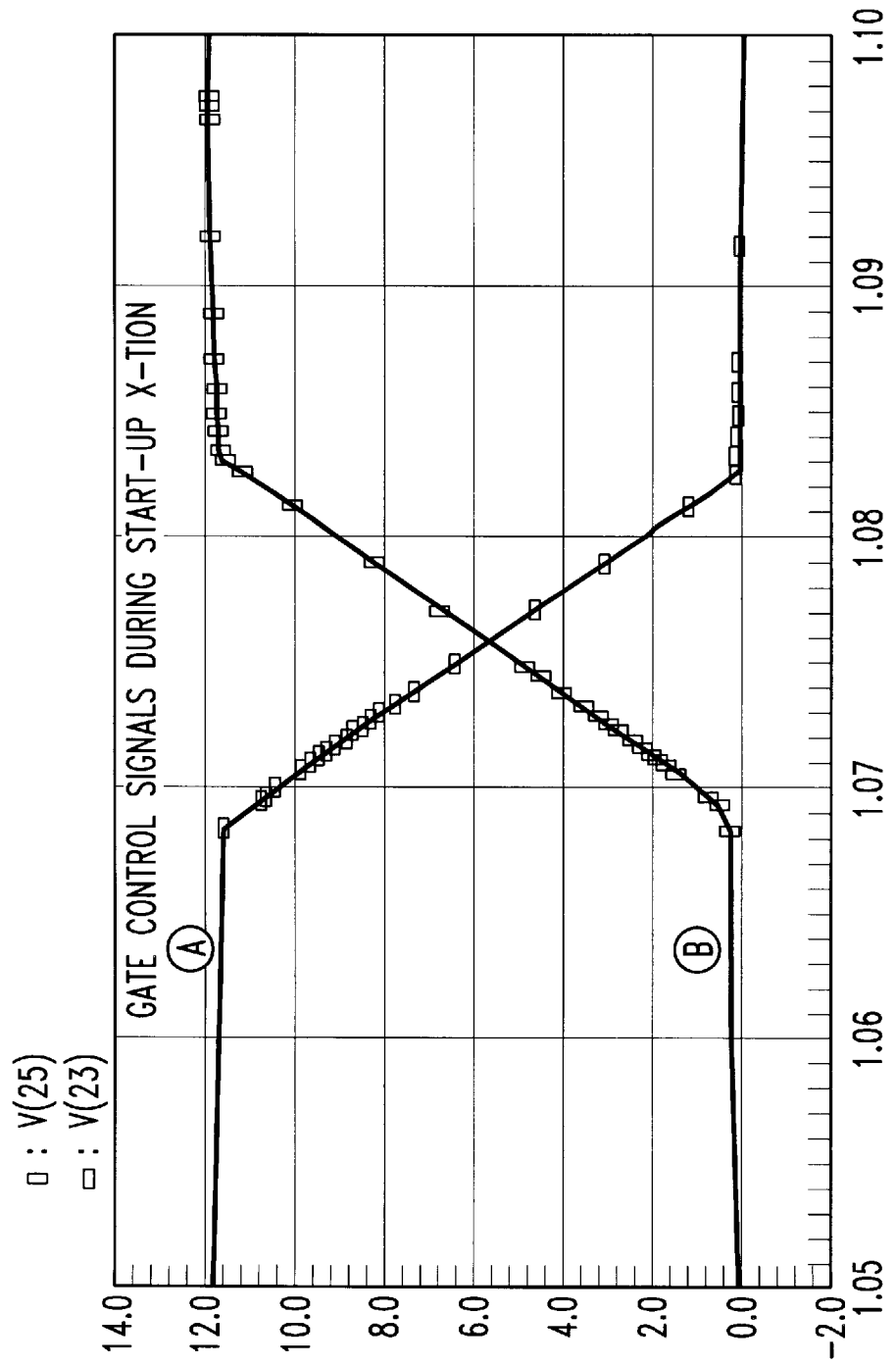
FIG. 8 is wave form diagram showing operating characteristics of the circuit of FIG. 7.

FIG. 7 shows a detailed schematic of one implementation of switch S2 from FIG. 5. The circuit has transmission gate 60 comprising transistors M8 and M22, transmission gate 62 comprising transistors M23 and M24, a on/off control gate 64 coupled to the mute pin current source, and additional current mirrors that control the transmission gates. The pin labeled UVN is connected to the chip level disable signal and pin SS (Silent Start) is connected to the external mute pin and capacitor 22. When the disable is high/UVN is low, the current source P10A gated by M42 is turned off and the SS/mute pin is pulled to VSS by an external means. With SS/mute at VSS, transistor M0 overcomes the 10u amps current mirrored into M27 and pulls gate control line A high. Transistor M28 will also be on hard with its current limited by resistor R29. The current from M28 will be mirrored by M6 into M2 and will pull gate control line B low. With the gate control lines in this state, A=high, B=low, transmission gate 62 (M8, M22) is off and transmission gate 60 (M23, M24) is on. This connects the VREF input to the PWM+ output. VREF is connected to +6 V and the PWM+ output is connected to the + input of the PWM comparator as described above. When the chip is enabled, UVN will go high and allow the current source P10A to charge capacitor 22 connected to the SS/mute pin. As the SS/mute pin gets within a PMOS threshold of VDD, M0 and M28 begin to turn off. The fixed current sources M27 and M32 slew the voltages on the gate control lines as SS/mute continues charging up to VDD. Gate control voltages A and B are shown in FIG. 8. At steady state with SS=VDD, A=low, B=high, M8 and M22 (transmission gate 62) are on the M23 and M24 (transmission gate 60) are off. This connects the E/A input representing the error amp or integrator output to the PWM+ pin which is connected to the +input of the PWM comparator at the integrated circuit top level.

We claim:

1. A silent start circuit comprising
   (a) a Class D amplifier having an input for receiving a signal with an audit frequency, means for sampling the audio input signal at a frequency substantially greater than the highest audit frequency in the audio input signal, and means for comparing the sampled audit signal to a reference voltage signal to provide an output series of width modulated pulses, each pulse having the amplitude of the reference voltage signal and a width proportional to the amplitude of the sampled audit signal, the series of pulses having a frequency substantially greater than said audio frequency;
   (b) a bridge driver circuit having an input for receiving the output series of pulses of the Class D amplifier and translating the voltage level of the pulses from the reference voltage to a driver voltage level, and means for generating a power mosfet gate driver signal comprising a series of output driver pulses having pulse widths proportional to the sampled audio signal and pulse amplitudes at the driver voltage level;
   (c) an amplifier having a first input connected to the audio input signal and through a feedback path to the output of the bridge driver circuit and an output coupled to the input of the Class D amplifier, said amplifier selectively switchable between a first mode of operation for integrating the audio input and a second mode of operation for summing the audio input and the Class D amplifier output.

2. The silent start circuit of claim 1 wherein the amplifier has two feedback paths between its output and its audio input.

3. The silent start circuit of claim 2 wherein one feedback path comprises a summing resistor and the other feedback path comprises an integrating capacitor.

4. The silent start circuit of claim 3 comprising a switch connected in series with the summing resistor, said switch being responsive to a disable signal for selectively opening and closing the feedback path through the summing resistor.

5. The silent start circuit of claim 1 further comprising a bridge circuit comprising a plurality of power mosfet devices for receiving the output power driving pulses from the bridge driver circuit, means for applying the power driver pulses to the gates of the power mosfets to generate output power voltage pulses at a power voltage level.

6. A silent start circuit comprising
   (a) a class D amplifier having
      an input for receiving an input comprising an error signal and audio signal with an audio frequency,
      an integrating amplifier coupled to the input for integrating the input signal to provide a first comparator input signal,
      a comparator for comparing the first comparator input signal to a second comparator input comprising a reference oscillator voltage signal to generate an output series of width modulated pulses, each pulse having the amplitude of the reference voltage signal and a width proportional to the amplitude of the sampled audio signal, the series of pulses having a frequency substantially greater than said audio frequency;
   switch means having
      a disable position for connecting the first comparator input to a reference voltage source to generate a comparator output having a 50% duty cycle saturating the integrating amplifier, and
      an enable position for gradually connecting the output of the integrating amplifier to the first comparator input and gradually unsaturating the integrating amplifier.

7. The silent start amplifier of claim 6 further comprising:
   (b) a bridge driver circuit having an input for receiving the output series of pulses of the class D amplifier and translating the voltage level of the pulses from the reference voltage to a driver voltage level, and means for generating a power mosfet gate driver signal comprising a series of output driver pulses having pulse widths proportional to the sampled audio signal and pulse amplitudes at the driver voltage level.

8. The silent start amplifier of claim 7 further comprising
   (c) a bridge circuit comprising a plurality of power mosfet devices for receiving the output power driving pulses from the bridge driver circuit, means for applying the power driver pulses to the gates of the power mosfets to generate output power voltage pulses at a power voltage level.

9. The silent start amplifier of claim 6 wherein the switch means comprises variable resistors for gradually increasing the resistance between the reference voltage source and the first comparator input and for gradually reducing the resistance between the integrator output and the comparator input when the switch means is placed in its enable position.

10. The silent start amplifier of claim 6 further compromising a current source and a capacitor, said capacitor coupled to the variable resistors for changing their resistance in accordance with the charge on the capacitor.

11. The silent start amplifier of claim 10 wherein the variable resistors comprise first and second transmission gates and the capacitor is coupled to the gates of both transmission gates.

* * * * *